(12) United States Patent
Ju

(10) Patent No.: US 7,284,993 B1
(45) Date of Patent: Oct. 23, 2007

(54) ELECTRICAL CONNECTOR ARRAY

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 11/543,042

(22) Filed: Oct. 5, 2006

(51) Int. Cl.
H01R 12/00 (2006.01)
(52) U.S. Cl. .......................................... 439/66; 439/71
(58) Field of Classification Search .................. 439/65, 439/66, 71
See application file for complete search history.

(56) References Cited

U.S. PATENT DOCUMENTS 5,380,210 A * 1/1995 Grabbe et al. ............... 439/66
5,820,389 A * 10/1998 Hashiguchi .................. 439/66
6,561,819 B1 * 5/2003 Huang et al. ................. 439/66
7,083,429 B2 * 8/2006 Hashimoto et al. .......... 439/71
7,128,580 B2 * 10/2006 Liao et al. .................... 439/71
2005/0014398 A1 * 1/2005 Liao et al. .................... 439/71
2005/0042897 A1 * 2/2005 Zhang et al. ................. 439/71
2005/0124187 A1 * 6/2005 Olson et al. .................. 439/71

* cited by examiner

Primary Examiner—Michael C. Zarroli
(74) Attorney, Agent, or Firm—Rosenberg, Klein & Lee

(57) ABSTRACT

An electrical connector that is in constricted contact with corresponding electronic components is disclosed. The electrical connector includes an insulated body and a conductive terminal. A plurality of receiving holes having a first wall of hole and a second wall of hole is mounted on the insulated body while an elastic part projecting outwards from the receiving hole is arranged on the conductive terminal. The first wall of hole on at least one side of the receiving hole is higher than the second wall of hole.

12 Claims, 5 Drawing Sheets

ELECTRICAL CONNECTOR ARRAY

BACKGROUND OF THE INVENTION

The present invention relates to an electrical connector, especially to an electrical connector in constricted contact with the corresponding electronic components.

Now there is a LGA((land grid array) chip module applied on some electronic products such as computers. The connecting end of such chip module looks like a washer and is in constricted connection with conductive terminals of corresponding electronic components. The electrical connector available now includes an insulated body with a terminal receiving slot and a conductive terminal mounted inside the terminal receiving slot. Two contact parts projecting outwards the insulated body are disposed on the conductive terminal and the chip module contacts with the corresponding electronic components through the two contact parts of the conductive terminal. However, such kind of design may make the contact part of the conductive terminal overbend. This leads to large normal contact force on the chip module. After long-term constriction, the terminals and the chip modules are easy to get damage that leads to negative effect on electrical connection between two corresponding electronic components. After long-term constriction, the terminals and the chip modules are easy to get damage that leads to negative effect on electrical connection between two corresponding electronic components.

The way for providing against surface on the insulated body is to dispose a projecting object on the insulated body directly. Refer from FIG. 1 to FIG. 2, an electrical connector consists of an insulated body 1 and at least one conductive terminal 2. A lateral side 11 and receiving holes 12 for accommodation of the conductive terminals 2 are disposed on the insulated body 1. Around the receiving holes 12 are walls of hole 13. A projecting part 14 is arranged on the insulated body 1 as an against surface for corresponding electronic components. Due to size of the projecting part, such kind of design provides poor against effect and causes waste of space.

Therefore, there is a need to provide an electrical connector for overcoming above shortcomings.

SUMMARY OF THE INVENTION

It is a primary object of the present invention to provide stable electrical connection between the two connected electronic components.

In order to achieve object, an electrical connector according to the present invention includes an insulated body and a conductive terminal. A plurality of receiving holes having a first wall of hole and a second wall of hole is mounted on the insulated body while an elastic part projecting outwards the receiving hole is arranged on the conductive terminal. The first wall of hole on at least one side of the receiving hole is higher than the second wall of hole. Compared with devices available now, the connector of the present invention reduces damages of the conductive terminal and the chip module. Moreover, the present invention also provide two corresponding electronic components better electrical connection with less space and better against effect.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Figure 1:
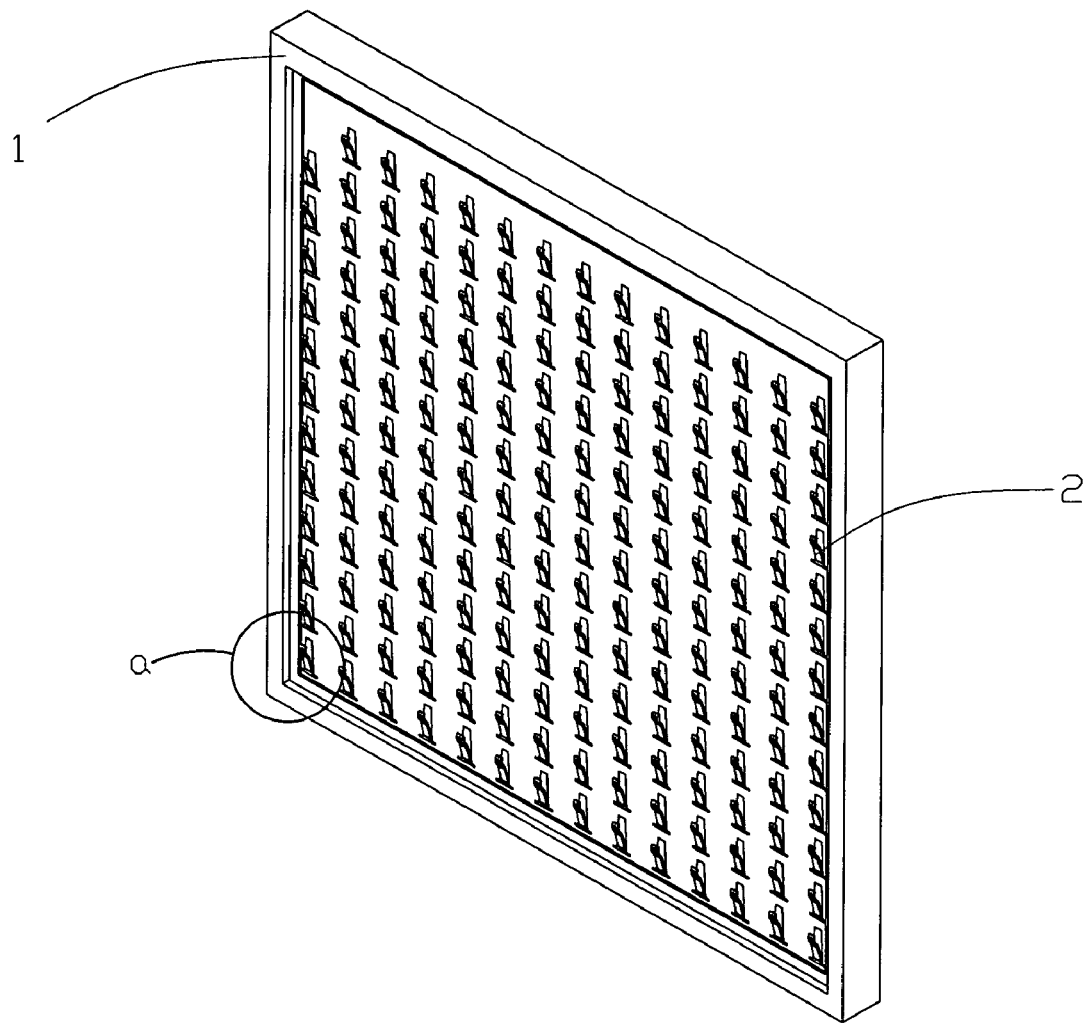
FIG. 1 is a perspective view of a conventional electrical connector.
Figure 2:
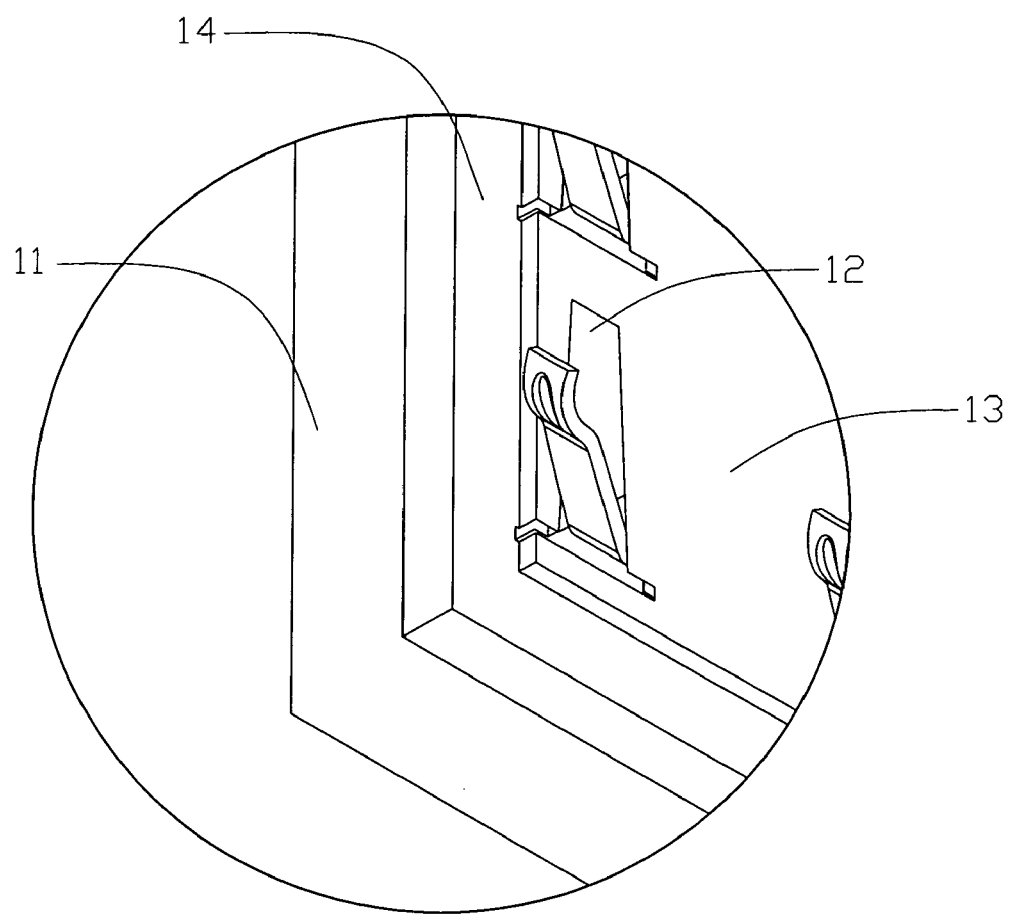
FIG. 2 is a partial enlarged view of a conventional electrical connector.
Figure 3:
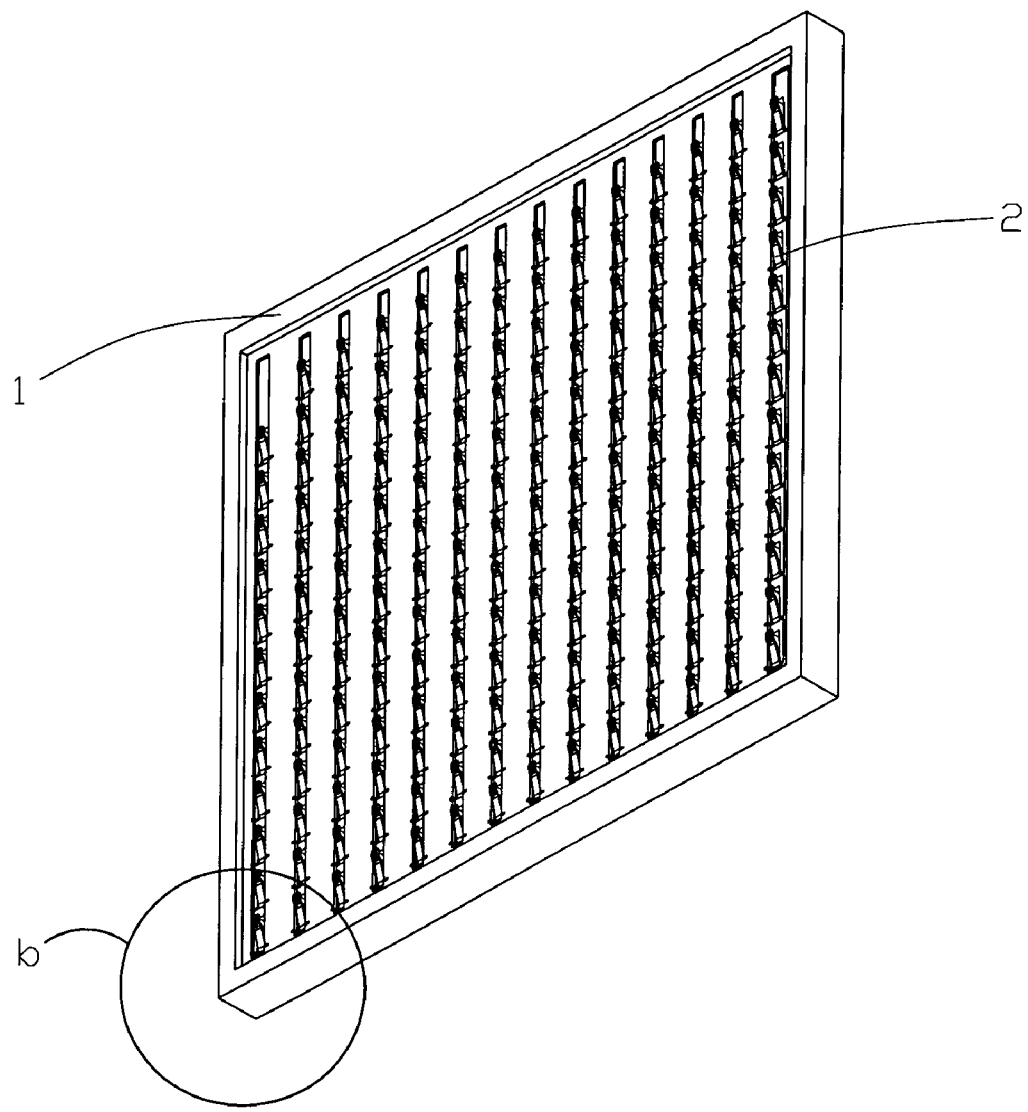
FIG. 3 is a perspective view of an electrical connector according to the present invention.
Figure 4:
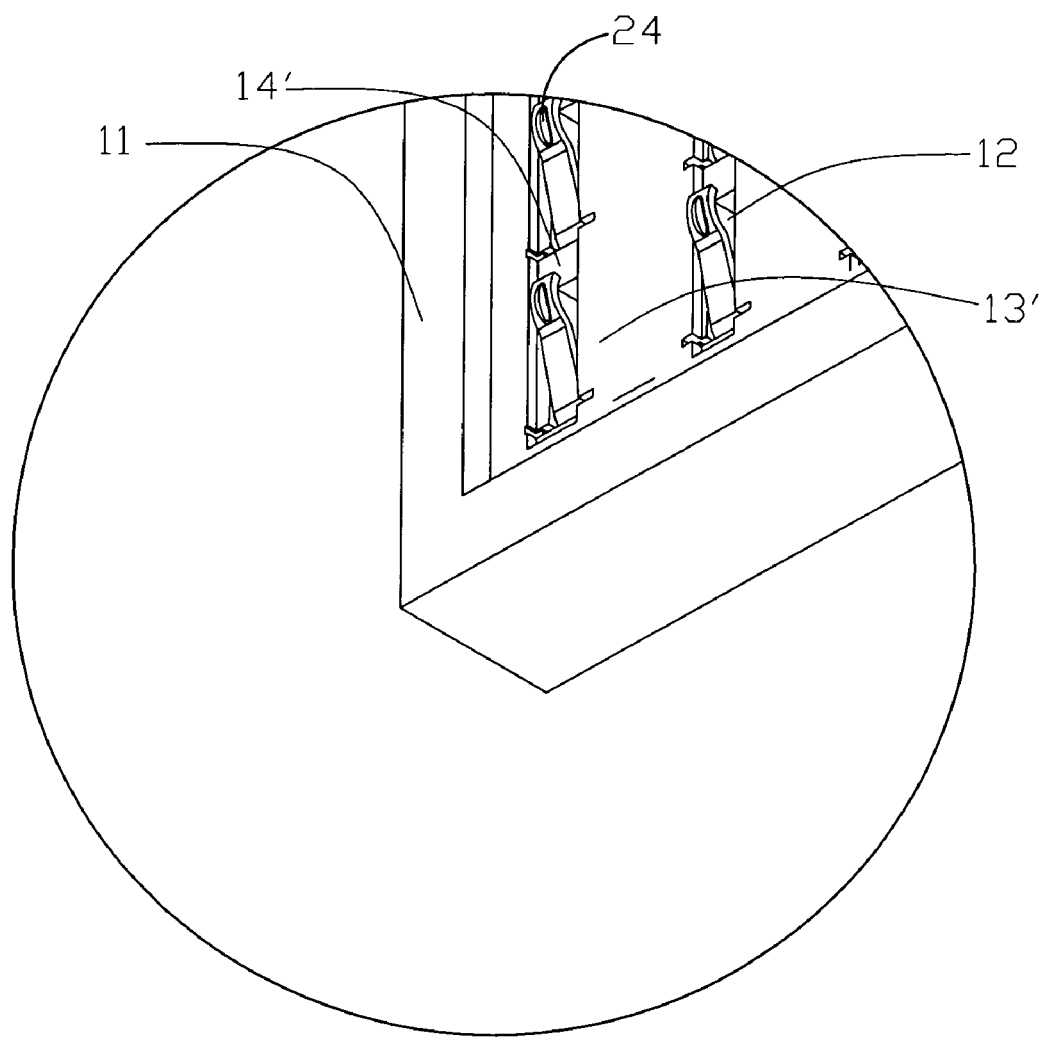
FIG. 4 is a partial enlarged view of an electrical connector according to the present invention.
Figure 5:
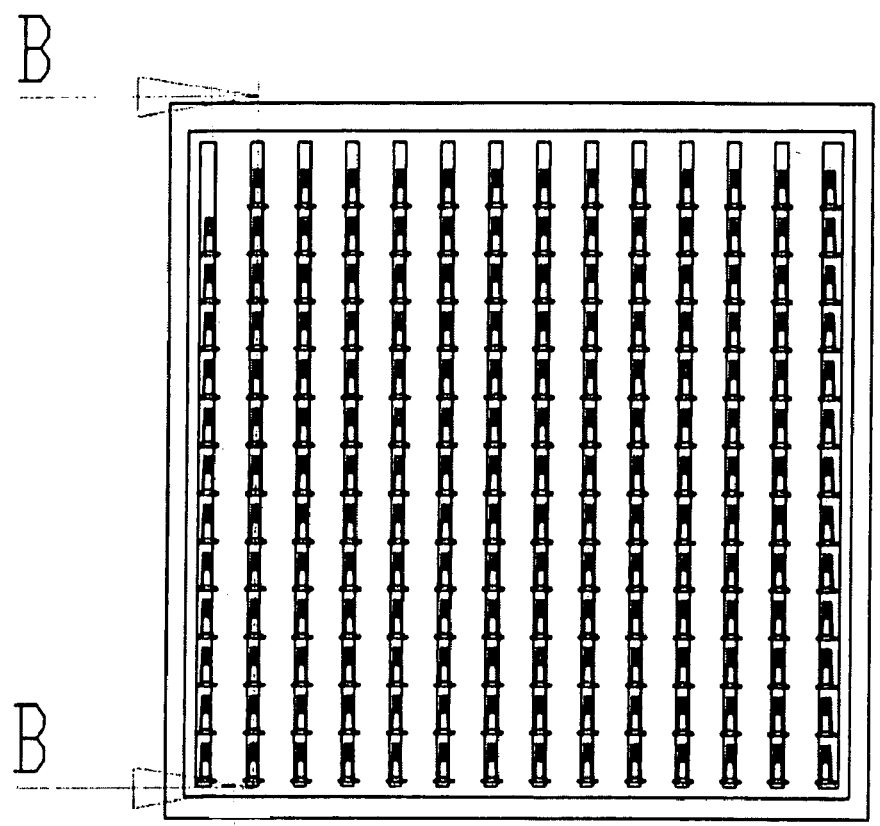
FIG. 5 is a top view of an electrical connector according to the present invention.
Figure 6:
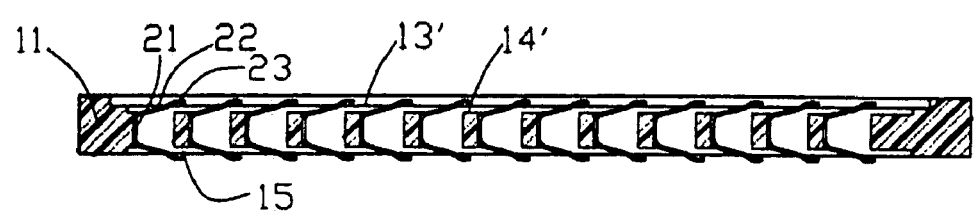
FIG. 6 is a cross-sectional view along B-B line of the embodiment according to the present invention.

Refer from FIG. 3 to FIG. 6, an electrical connector for connecting two corresponding electronic components according to the present invention is revealed. The two corresponding electronic components can be a LGA chip module and a circuit board, not shown in figures. They can also be other electronic components such as two circuit boards connected with each other. The electrical connector consists of an insulated body 1 and a conductive terminal 2.

The conductive terminal 2 is mounted inside a receiving hole 12 of the insulated body 1. The conductive terminal 2 includes a fixing part 21 affixed to a fixing portion 15 of the insulated body 1, an elastic part 22 extending slantingly from each of two ends of the fixing part 21, and a contact part 23 that connects with the elastic part 22 nonlinearly. A hole is arranged on lateral side of the elastic part 22. In this embodiment, the conductive terminal 2 has two contact parts 23 for double-side constricted contact. The two contact parts 23 are formed by being bent towards the same direction and are in constricted contact with the corresponding electronic components.

A plurality of receiving holes 12 is disposed on the insulated body 1. The receiving hole 12 is composed of a first wall of hole 13' and a second wall of hole 14' that crosses the first wall of hole 13'. The first wall of hole 13' on one side of the receiving hole 12 is higher than the second wall of hole 14' so as to increase deformation space for the fixing part 21 of the conductive terminal 2. Moreover, the first wall of hole 13' prevents over-pressing of the corresponding electronic components. The first wall of hole 100 of the receiving hole 12 on two sides of the connector is higher than the second wall of hole 101. The first wall of hole 13' and the second wall of hole 14' can also have the same height while a projecting part is arranged on the insulated body for against and connecting with corresponding electronic components. The two elastic parts 22 are located over the second wall of hole 14' and a space is formed between the elastic parts 22 and the first wall of hole 13'. The second wall of hole 14' is arranged on the direction that the conductive terminal 2 bends towards.

Figure 7:
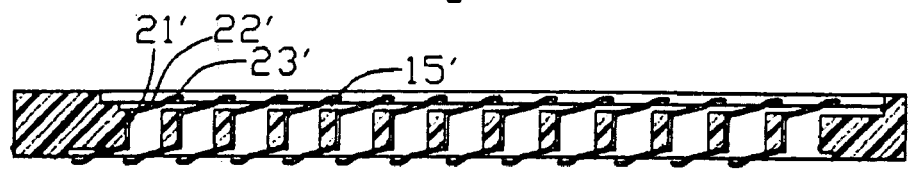
FIG. 7 is a cross-sectional view of another embodiment according to the present invention.

Refer to FIG. 7, another embodiment of the present invention is disclosed. The difference between this embodiment and the above one is in that: the two elastic parts 22 are formed by being bent toward opposite directions so that the two elastic parts 22 are located over different second wall of hole 14' and a space is formed between the elastic parts 22 and the first wall of hole 13'. The fixing part 21' is affixed to a fixing portion 15' of the insulated body 1.

An electrical connector according to the present invention uses the wall of hole as against surface so as to avoid over pressing the corresponding components as well as reduce damages of terminals and chip modules. It also provides better electrical connection between the corresponding electronic components, saves the space and improves against effect.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An electrical connector array comprising:
   an insulated body with a plurality of receiving holes on at least one side thereof and each receiving hole having a first wall on two lateral sides thereof and a second wall on two longitudinal sides thereof while the first wall is higher than the second wall; and
   a plurality of conductive terminals, each disposed with an elastic part on an opposing end thereof to project outwards from a respective receiving hole, wherein each elastic part has a distal end disposed in an aligned relationship with a respective second wall of the insulated body.

2. The electrical connector array as claimed in claim 1, wherein the elastic part is disposed on each of two ends of the conductive terminal.

3. The electrical connector array as claimed in claim 2, wherein the elastic parts on two ends of the conductive terminal bend towards the same direction.

4. The electrical connector array as claimed in claim 3, wherein the elastic part on at least one end of the conductive terminal is disposed over the second wall and a space is formed between the elastic part and the first wall.

5. The electrical connector array as claimed in claim 2, wherein the elastic parts on two ends of the conductive terminal bend towards opposite directions.

6. The electrical connector array as claimed in claim 5, wherein the elastic parts on two ends of the conductive terminal are disposed over different second walls and a space is formed between the elastic parts and the first wall.

7. The electrical connector array as claimed in claim 1, wherein the first wall and the second wall cross each other.

8. The electrical connector array as claimed in claim 1, wherein the second wall is arranged on the position that the conductive terminal bends towards.

9. The electrical connector array as claimed in claim 1, wherein the second wall has a projecting part arranged on the insulated body.

10. The electrical connector array as claimed in claim 1, wherein the conductive terminal extends slantingly from one end of the receiving hole and having the elastic part disposed on a rear end thereof.

11. The electrical connector array as claimed in claim 10, wherein the conductive terminal extends slantingly from one end of the receiving hole and connects with the elastic part nonlinearly.

12. The electrical connector array as claimed in claim 1, wherein a hole is disposed on one side of the elastic part.

* * * * *